(12) United States Patent
Peng et al.

(10) Patent No.: US 7,724,514 B2
(45) Date of Patent: May 25, 2010

(54) SERVER CHASSIS WITH ACCESS FLAP

(75) Inventors: Wen-Tang Peng, Taipei Hsien (TW); Jun-Xiong Zhang, Shenzhen (CN); Zhi-Xin Li, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/210,494

(22) Filed: Sep. 15, 2008

(65) Prior Publication Data

US 2009/0161310 A1    Jun. 25, 2009

(30) Foreign Application Priority Data

Dec. 24, 2007    (CN) .......................... 2007 1 0203373

(51) Int. Cl.
*H05K 7/20*    (2006.01)
*H05K 5/00*    (2006.01)
*A47B 77/08*    (2006.01)

(52) U.S. Cl. ............................. 361/679.49; 361/679.48; 454/184; 312/236

(58) Field of Classification Search .................................
361/679.49–679.54, 678, 690, 692, 694, 361/695; 454/184; 312/236, 223.2; 174/16.1–16.3
See application file for complete search history.

(56) References Cited

U.S. PATENT DOCUMENTS

| 6,058,011 | A | * | 5/2000 | Hardt et al. | .................. 361/694 |
| 6,826,456 | B1 | * | 11/2004 | Irving et al. | ................ 700/299 |
| 2007/0053143 | A1 | * | 3/2007 | Kang | ........................ 361/678 |

* cited by examiner

*Primary Examiner*—Seungsook Ham
*Assistant Examiner*—Jerry Wu
(74) *Attorney, Agent, or Firm*—Clifford O. Chi

(57) ABSTRACT

A server chassis includes a base defining an opening, a rotating plate, a sliding plate, and first and second elastic members. The base includes a middle plate opposite to the opening and defines a space communicating with the opening. The rotating plate defines a plurality of first air holes. The sliding plate defines a plurality of second air holes. The rotating plate is rotated toward the middle plate when the functional module is inserted into the space, the sliding plate abuts against the middle plate and slides toward the opening, and the second air holes align with the first air holes. The second elastic member restores the rotating plate to obstruct the opening when the functional module is drawn out, and the first elastic member restores the sliding plate to make the second air holes be staggered with the first air holes.

16 Claims, 10 Drawing Sheets

SERVER CHASSIS WITH ACCESS FLAP

CROSS-REFERENCES TO RELATED APPLICATION

Relevant subject matter is disclosed in the co-pending U.S. patent application with application Ser. No. 12/192,080, filed on Aug. 14, 2008, and having a same title with the present application, which is assigned to the same assignee with this patent application.

BACKGROUND

1. Field of the Invention

The present invention relates to server chassis, and particularly to a server chassis having an access flap.

2. Description of Related Art

Generally, a functional module, such as a power supply, can be inserted into or drawn out of a server chassis through an opening. The opening of the server chassis is not shielded when the functional module is removed from the server chassis, allowing air outside the server chassis to flow into the server chassis, thereby interfering with the normal airflow in the server chassis. This potentially impairs an efficiency of heat dissipation in the server chassis. A shielding apparatus is typically attached to the chassis by a plurality of screws, which makes the installation and detachment of the shielding apparatus tedious and time-consuming.

What is needed, therefore, is a server chassis which overcomes the above-mentioned problems.

DETAILED DESCRIPTION OF THE EMBODIMENTS

Figure 1:
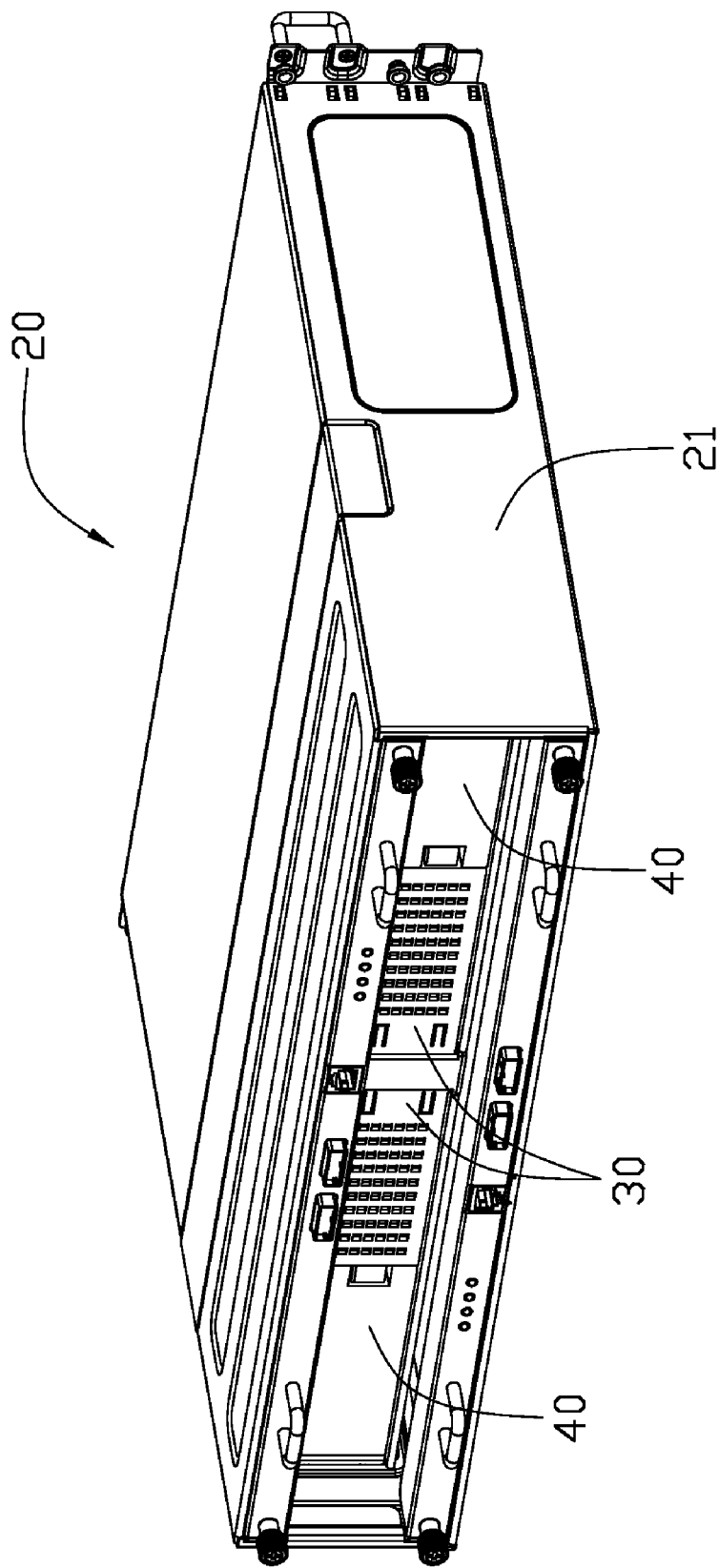
FIG. 1 is an assembled, isometric view of an embodiment of a server chassis.

Referring to FIG. 1, a server chassis includes a base 20, two first access flaps 30, and two second access flaps 40.

Figure 2:
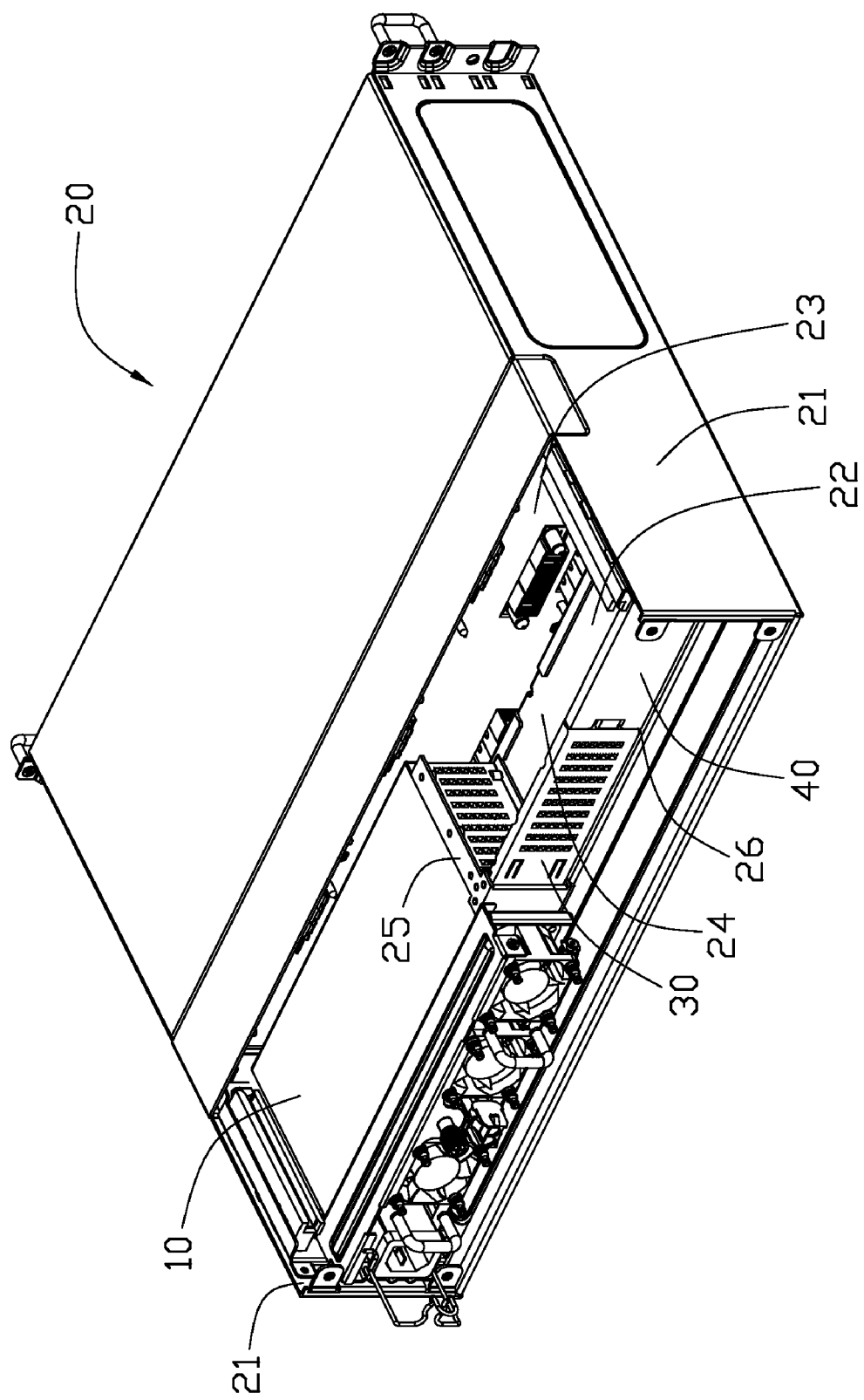
FIG. 2 is a partially cutaway view of FIG. 1, showing a functional module mounted to the server chassis, the server chassis including a mounting plate, a first access flap, and a second access flap.

Referring to FIG. 2, the base 20 includes a bottom panel 22, two parallel side panels 21 vertically extending from opposite sides of the bottom panel 22 respectively, a middle plate 23 connecting to the side panels 21, and a mounting plate 25 vertically mounted to the bottom panel 22 and parallel to the side panels 21. A space 24 is defined among each side panel 21, the middle plate 23, and the mounting plate 25, for receiving a functional module 10, such as a power supply or a communicating module. An opening 26 opposite to the middle plate 23 is defined in a rear side of the base 20 between each side panel 21 and the mounting plate 25, for the functional module 10 passing therethrough to enter into the space 24.

Figure 3:
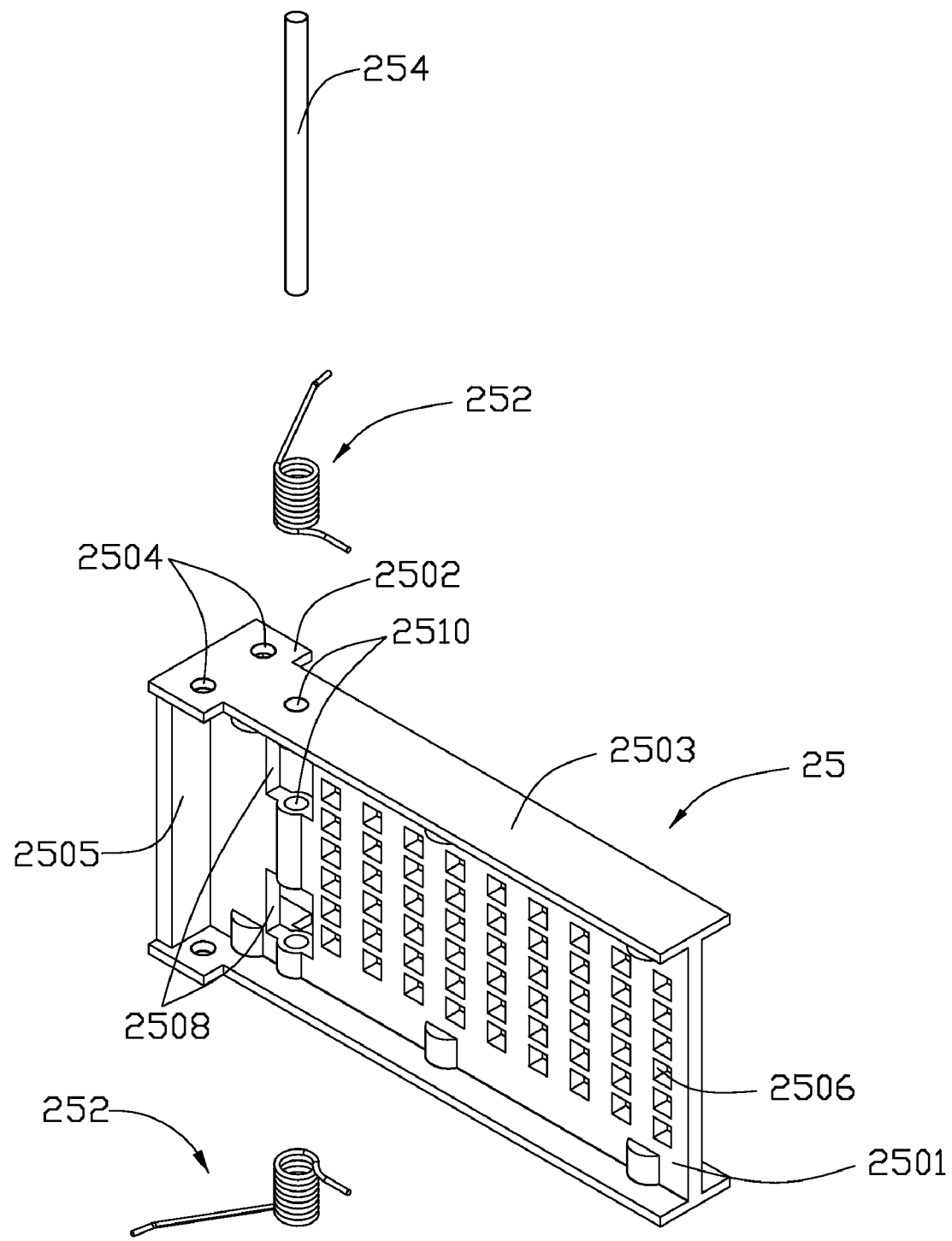
FIG. 3 is an exploded, isometric view of the mounting plate of FIG. 2, but viewed from another perspective.
Figure 4:
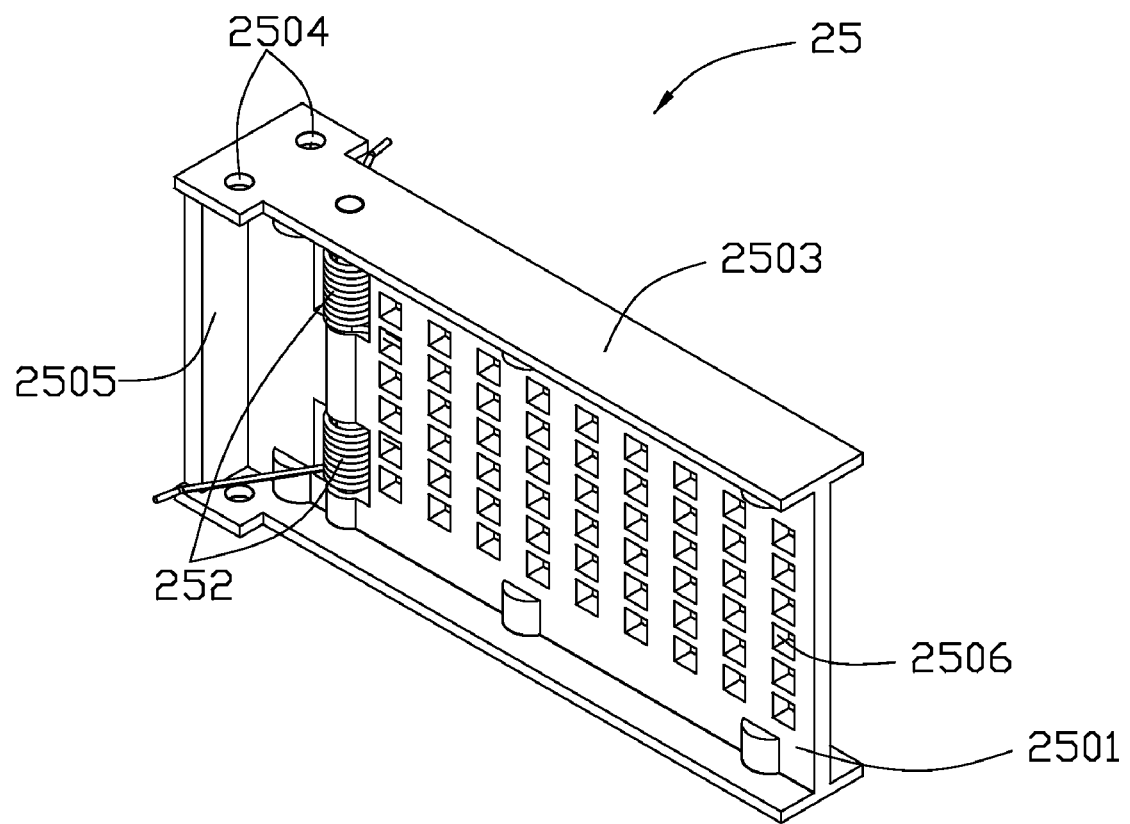
FIG. 4 is an assembled view of the mounting plate of FIG. 3.

Referring to FIGS. 3 and 4, the mounting plate 25 includes a vertical mounting wall 2501, two horizontal sidewalls 2503 extending from a top side and a bottom side of the mounting wall 2501, and an end wall 2505 extending from a vertical end of the mounting wall 2501. Each of the sidewalls 2503 forms a tab 2502 adjoining a corresponding end of the end wall 2505. Each tab 2502 defines two pivoting holes 2504. The mounting wall 2501 defines a plurality of vents 2506 therein. Two receiving holes 2508 are defined in the mounting wall 2501 adjacent to the end wall 2505. A through hole 2510 is defined in the mounting plate 25, extending through the sidewalls 2503 and the mounting wall 2501, and communicating with the receiving holes 2508. Two resilient members, such as torsion springs 252, are placed in the receiving holes 2508. A shaft 254 passes through the torsion springs 252 and is engaged in the through hole 2510 of the mounting plate 25, to mount the torsion springs 252 to the mounting plate 25.

Figure 5:
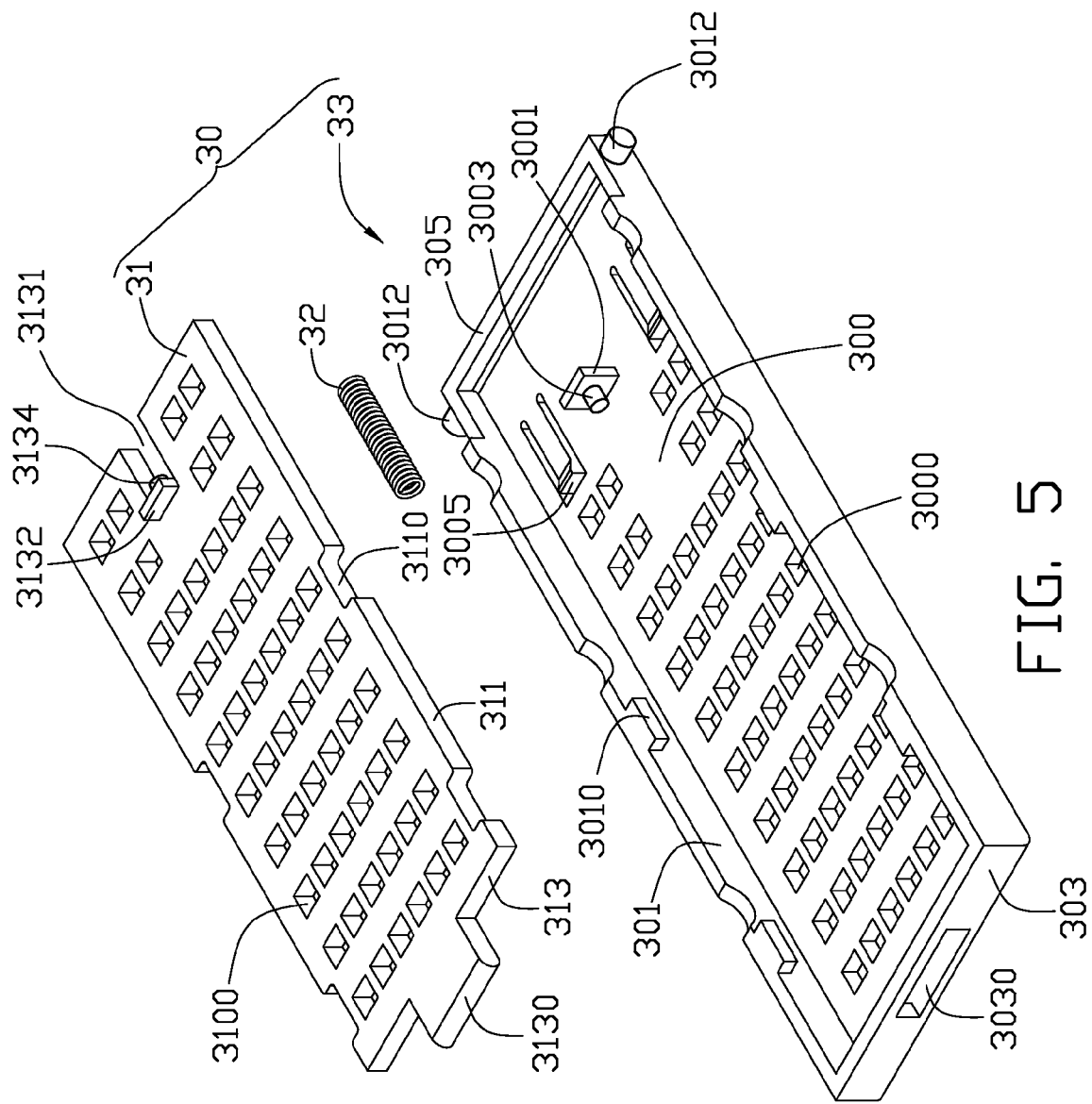
FIG. 5 is an exploded, isometric view of the first access flap of FIG. 2, but viewed from another perspective.

Referring to FIG. 5, each first access flap 30 includes a sliding plate 31, a rotating plate 33, and a resilient member such as a compression spring 32. The rotating plate 33 includes a main wall 300, two first sidewalls 301 perpendicularly extending from two opposite sides of the main wall 300, a second sidewall 303 perpendicularly extending from an end of the main wall 300, and a third sidewall 305 opposite to the second sidewall 303. The main wall 300 defines a plurality of first air holes 3000 therein. Two elastic stop members 3005 are formed on an inner surface of the main wall 300 adjacent to the third sidewall 305. A block 3001 protrudes from the inner surface of the main wall 300 between the stop members 3005. A post 3003 extends from the block 3001 in a direction towards the second sidewall 303. The distance between the block 3001 and the third sidewall 305 is less than the distance between the stop members 3005 and the third sidewall 305. Each first sidewall 301 has two spaced protrusions 3010 extending toward the opposite sidewall 301. A pivoting portion 3012 protrudes from each first sidewall 301 adjacent to the third sidewall 305. A slot 3030 is defined in the second sidewall 303.

The sliding plate 31 includes two opposite first sidewalls 311, and two opposite second sidewalls 313. The sliding plate 31 defines a plurality of second air holes 3100 therein, corresponding to the first air holes 3000 of the main wall 300. Each first sidewall 311 of the sliding plate 31 defines two spaced gaps 3110, corresponding to the protrusions 3010 of a corresponding first sidewall 301. An engaging portion 3130 extends from one of the second sidewalls 313, corresponding to the slot 3030 of the second sidewall 303. A cutout 3131 is defined in the sliding plate 31 through the other second sidewall 313. A fixing plate 3132 parallel with the second sidewalls 313 perpendicularly extends from the sliding plate 31 adjacent to the cutout 3131. A post 3134 perpendicularly extends from the fixing plate 3132 toward the cutout 3131.

Figure 6:
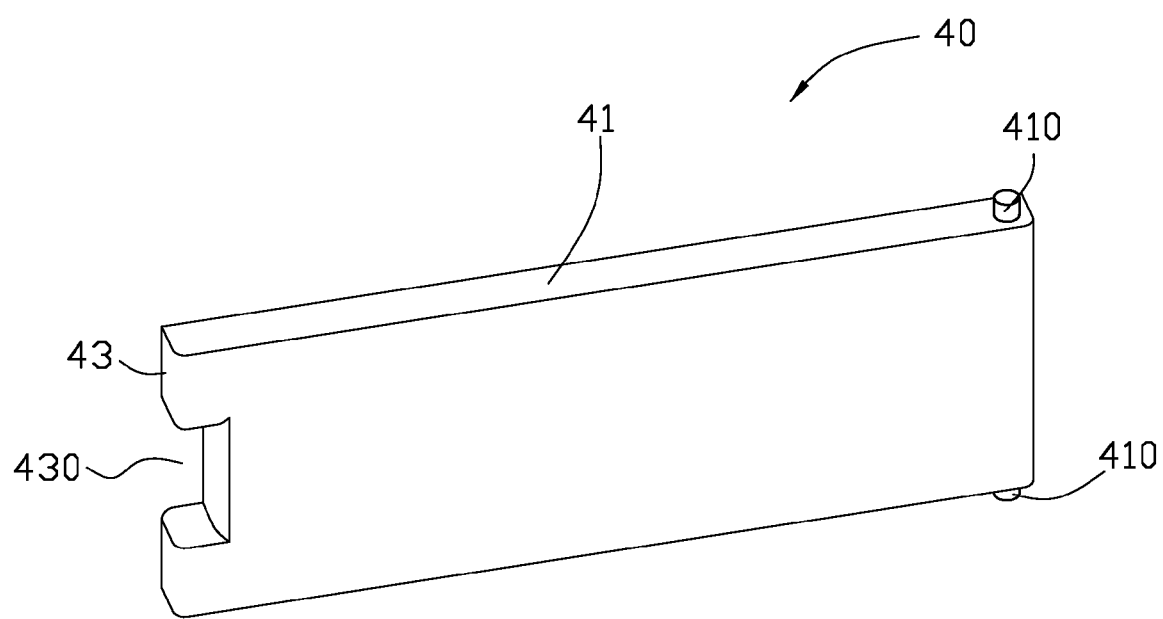
FIG. 6 is an isometric view of the second access flap of FIG. 2.

Referring to FIG. 6, each second access flap 40 includes two opposite first sidewalls 41, and two opposite second sidewalls 43. A pivoting portion 410 extends from each first sidewall 41 adjacent to a first of the second sidewalls 43. A notch 430 is defined in the second access flap 40 through a second of the second sidewalls 43.

Figure 7:
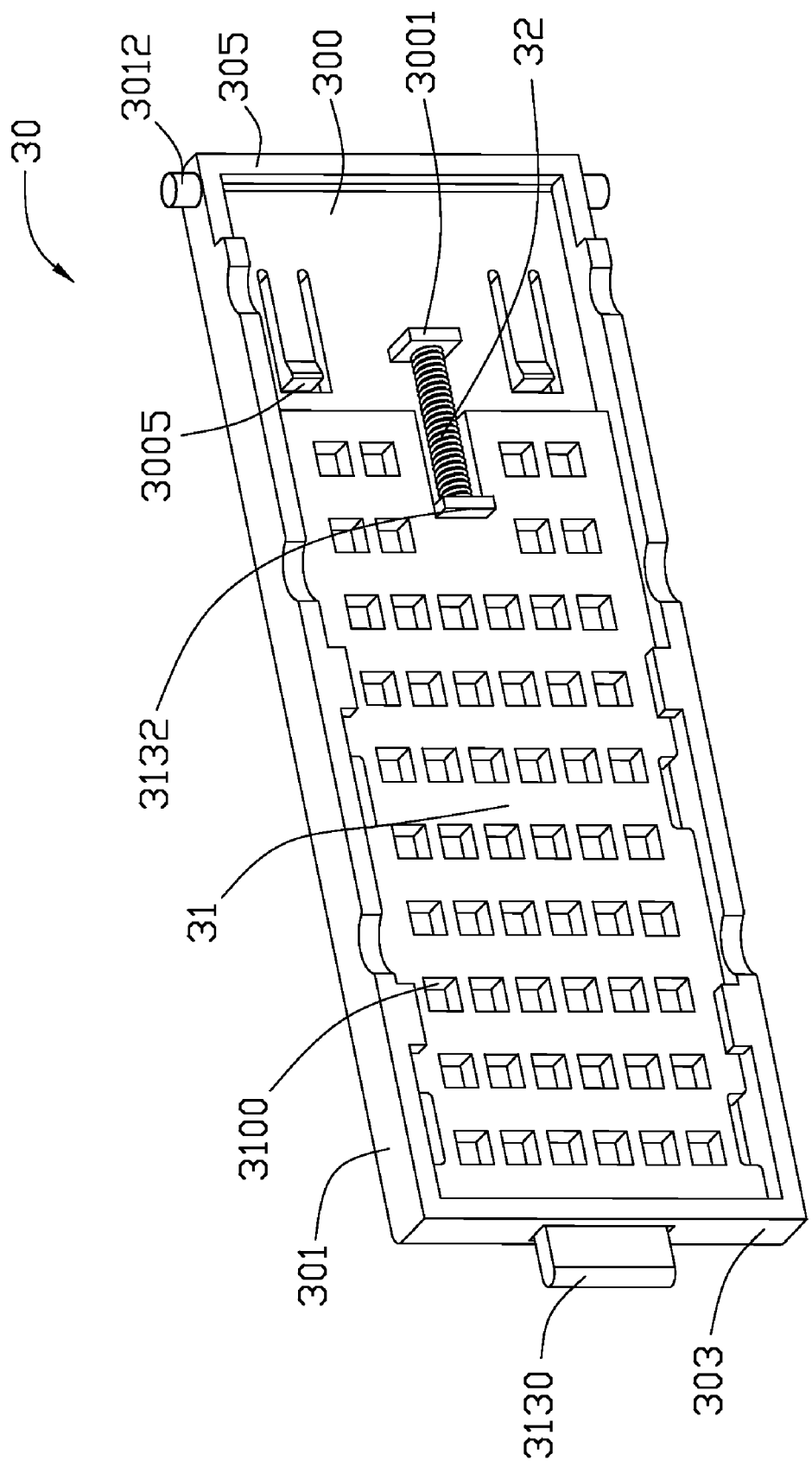
FIG. 7 is an assembled view of FIG. 5, but viewed from another perspective.

Referring to FIG. 7, in assembly, the sliding plate 31 is attached to the main wall 300 of the rotating plate 33 with protrusions 3010 extending through the corresponding gaps 3110. The sliding plate 31 is moved to make the gaps 3110 stagger with the protrusions 3010 of the rotating plate 33. The engaging portion 3130 of the sliding plate 31 extends through the slot 3030 of the rotating plate 33. Opposite ends of the compression spring 32 are placed around the posts 3003, 3134 of the rotating plate 33 and the sliding plate 31. The block 3001 and the fixing plate 3132 abut against the opposite ends of the compression spring 32, and prevent the compression spring 32 from disengaging from the posts 3003, 3134.

Figure 8:
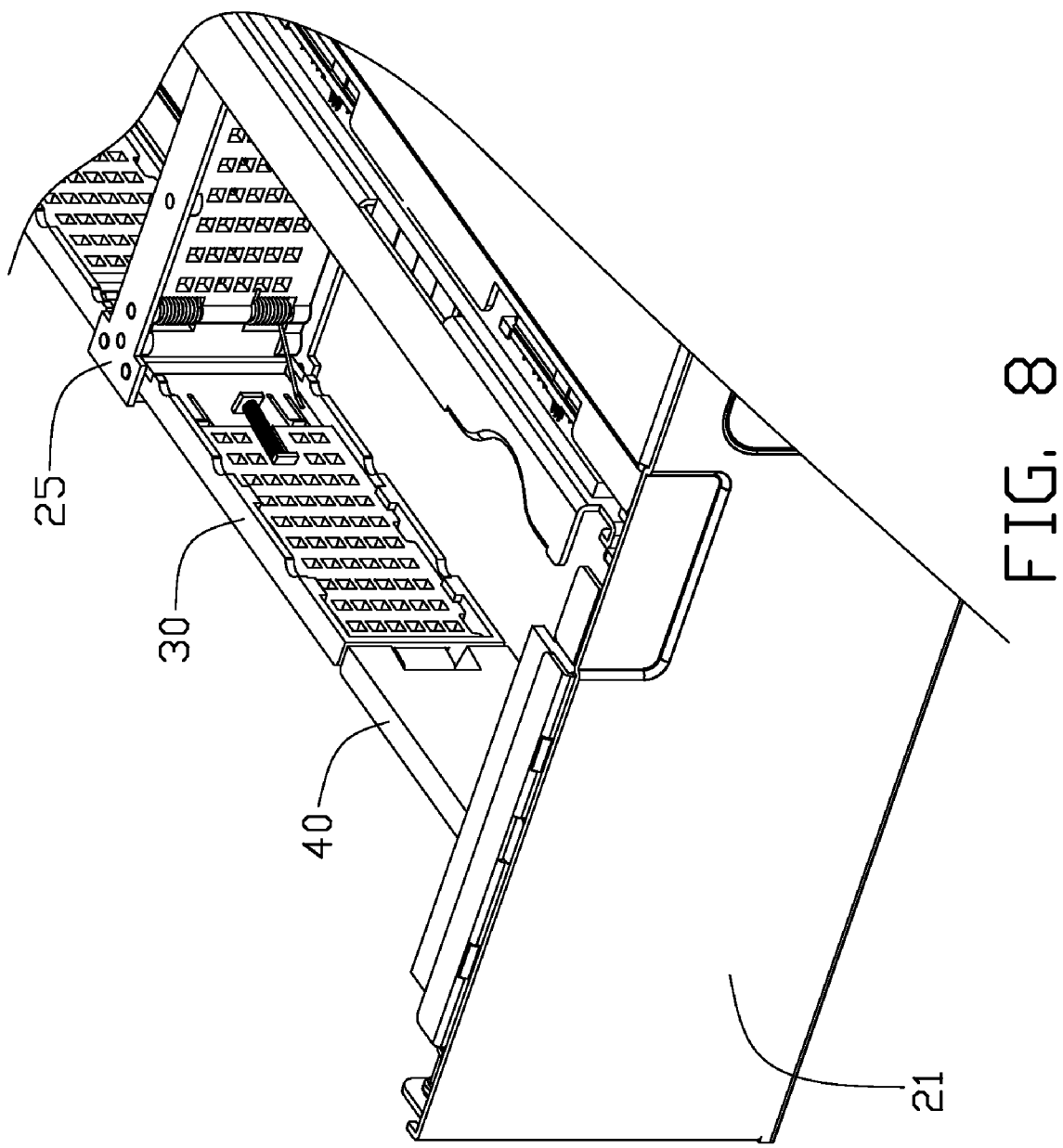
FIG. 8 is a partial, enlarged view of FIG. 2, but viewed from another perspective and not showing the functional module.
Figure 10:
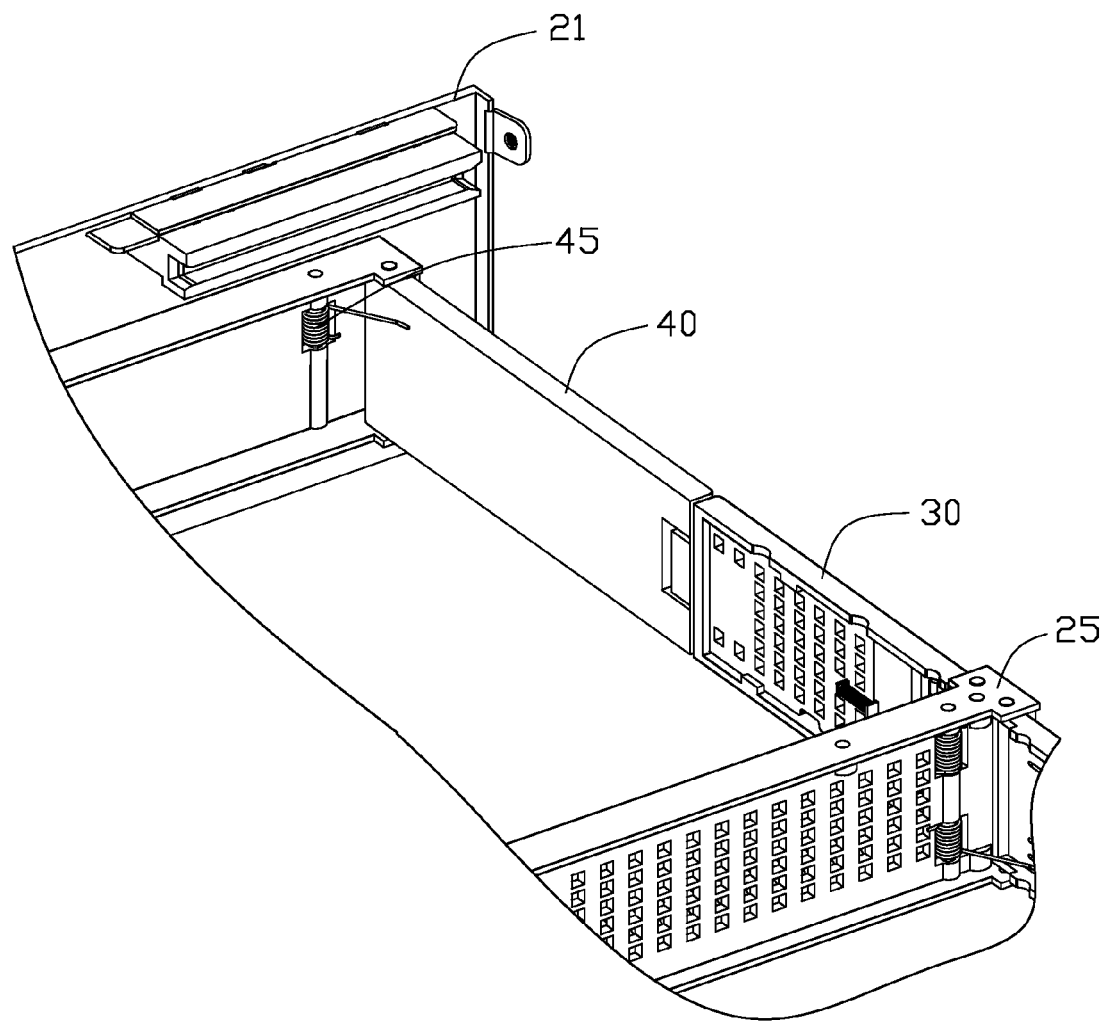
FIG. 10 is a partial, enlarged view of FIG. 2, but viewed from another perspective and not showing the functional module.

Referring further to FIG. 8, the pivoting portions 3012 of each first access flap 30 is pivotably engaged in the corresponding pivoting holes 2504 of the mounting plate 25. The first access flap 30 is located at an inner side of the end wall 2505 of the mounting plate 25. Two arms of each torsion spring 252 are firmly engaged with the mounting wall 2501 of the mounting plate 25 and the inner surface of the main wall 300 of the rotating plate 33. Referring to FIG. 10, each second access flap 40 is pivotably mounted to the inner side of a corresponding side panel 21 via the pivoting portions 410. A torsion spring 45 is mounted between the side panel 21 and the corresponding second access flap 40. The second sidewall 43 contacts the second sidewall 303 of the rotating plate 33 of the first access flap 30, and the exposed engaging portion 3130 of the first access flap 30 is received in the notch 430 of the second access flap 40. As a result, the opening 26 for the functional module 10 passing therethrough is shielded by the first access flap 30 and the second access flap 40.

Figure 9:
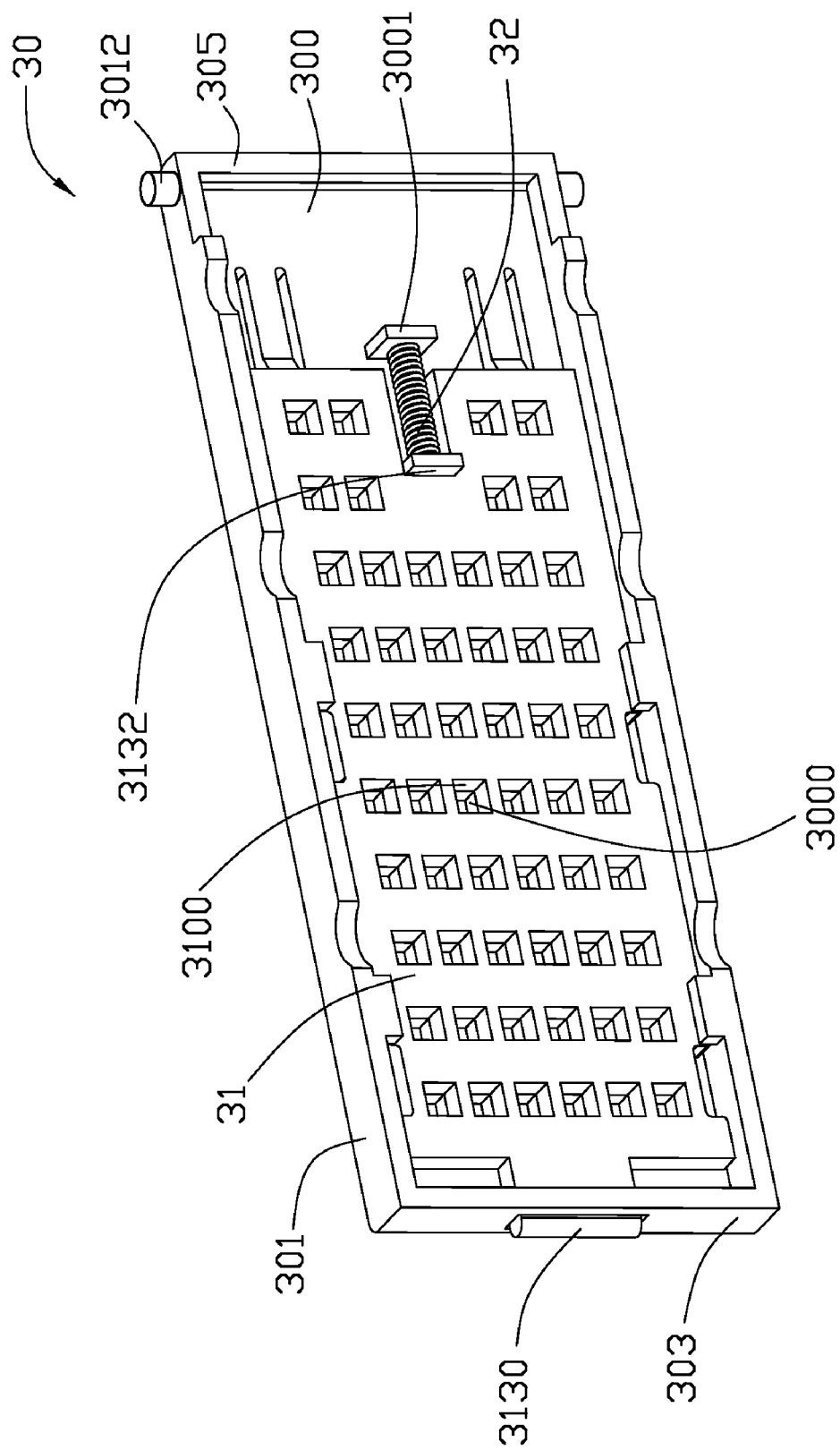
FIG. 9 is an isometric view similar to FIG. 7, but showing the first access flap in a using state.

Referring also to FIGS. 2 and 9, to assemble the functional module 10, the functional module 10 is pushed to urge a corresponding first access flap 30 to rotate about the pivoting portions 3012 toward the mounting plate 25 against the torsion springs 252, and a corresponding second access flap 40 to rotate about the pivoting portions 410 toward the corresponding side panel 21 of the base 20 against the torsion spring 45. The torsion springs 252, 45 are deformed. The middle plate 23 pushes the engaging portion 3130 to move together with the sliding plate 31 towards the third sidewall 305 of the rotating plate 33 when the engaging portion 3130 of the first access flap 30 abuts against the middle plate 23 of the base 20, until the sliding plate 31 contacts the stop members 3005 of the rotating plate 33. The compression spring 32 is deformed. The functional module 10 is entirely assembled in the base 20. The second air holes 3100 of the sliding plate 31 align with the first air holes 3000 of the rotating plate 33 and the vents 2506 of the mounting plate 25, to maintain good heat dissipation.

To draw the functional module 10 out from the base 20, the functional module 10 is pulled out. The torsion springs 252, 45 are restored to drive the first and second access flaps 30, 40 to rotate toward the opening 26 of the base 20. The compression spring 32 is restored to drive the sliding plate 31 to slide toward the second sidewall 303 of the rotating plate 33, until the engaging portion 3130 of the sliding plate 31 extends through the slot 3030 of the rotating plate 33. The second air holes 3100 of the sliding plate 31 are staggered with the first air holes 3000 of the rotating plate 33. Thus, the opening 26 of the base 20 is shielded by the first and second access flaps 30, 40.

In other embodiments, if a length of the first access flap 30 is long enough to shield the opening 26 of the base 20, the second flap 40 can be omitted.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A server chassis for mounting a functional module, comprising:
 a base comprising a middle plate, and defining a space at one side of the middle plate configured for receiving the functional module, and an opening in an end opposite to the middle plate, the opening communicating with the space for the functional module passing therethrough to enter into the space;
 a rotating plate with a first end being pivotably connected to a first side of the opening, and an opposite second end being positioned adjacent to an opposite second side of the opening; the rotating plate defining a plurality of first air holes therein;
 a first elastic member;
 a second elastic member connected to the rotating plate and the base for restoring the rotating plate;
 a sliding plate slidably attached to the rotating plate, the sliding plate defining a plurality of second air holes, the first elastic member connected between the sliding plate and the rotating plate; and
 wherein upon a condition that the functional module is inserted into the space, the rotating plate and the sliding plate are pushed to rotate toward the middle plate and deform the second elastic member, the sliding plate abuts against the middle plate and slides toward the opening to deform the first elastic member, and the second air holes align with the first air holes; upon a condition that the functional module is drawn out, the second elastic member restores the rotating plate and the sliding plate to obstruct the opening, and the first elastic member restores the sliding plate such that the second air holes are staggered with the first air holes.

2. The server chassis as claimed in claim 1, wherein the first elastic member is a compression spring, and the second elastic member is a torsion spring.

3. The server chassis as claimed in claim 1, wherein the base comprises a mounting plate formed at one side of the space perpendicular to the middle plate, the mounting plate defines a plurality of vents; upon a condition that the functional module is inserted into the space, the first and second air holes are aligned with the vents.

4. The server chassis as claimed in claim 3, wherein the mounting plate comprises a vertical mounting wall, and two horizontal sidewalls extending from opposite sides of the mounting wall; the vents are defined in the mounting wall; each of the sidewalls defines a pivoting hole adjacent to the opening; two pivoting portions protrude from opposite sides of the rotating plate, for pivotably engaging in the pivoting holes of the mounting plate.

5. The server chassis as claimed in claim 3, wherein a receiving hole is defined in the mounting plate adjacent to the opening; a through hole is defined in the mounting plate in communication with the receiving hole; the second elastic member is received in the receiving hole; the server chassis further comprises a shaft passing through the second elastic member and engaging in the through hole to fix the second elastic member in the receiving hole.

6. The server chassis as claimed in claim 3, wherein the mounting plate comprises an end wall adjacent to the opening and parallel with the middle plate; the rotating plate is located at an inner side of the end wall of the mounting plate.

7. The server chassis as claimed in claim 1, wherein the rotating plate comprises a main wall, and two first sidewalls extending from opposite sides of the main wall; each of the first sidewalls has two spaced protrusions extending therefrom toward the opposite first sidewall; the sliding plate comprises two opposite sliding plate sidewalls; each of the sliding plate sidewalls defines two spaced gaps corresponding to the protrusions of the first sidewall of the rotating plate.

8. The server chassis as claimed in claim 7, wherein the rotating plate comprises a second sidewall extending from the second end thereof; a slot is defined in the second sidewall; an engaging portion protrudes from the sliding plate and extends through the slot of the rotating plate.

9. The server chassis as claimed in claim 8, wherein the rotating plate comprises a third sidewall extending from the first end thereof; a block protrudes from the main wall adjacent to the third sidewall; a fixing plate extends from the sliding plate; a first post protrudes from the block; a second post protrudes from the fixing plate; the first elastic member is sandwiched between the block and the fixing plate; a first end of the elastic member is placed around the first post and a second end of the elastic member is placed around the second post.

10. The server chassis as claimed in claim 8, wherein the rotating plate comprises a third sidewall extending from the first end thereof; two elastic stop members extend from the main wall adjacent to the third sidewall, for abutting against the sliding plate.

11. A server chassis for mounting a functional module, comprising:
  a base comprising a middle plate, and defining a space at one side of the middle plate configured for receiving the functional module and an opening in an end opposite to the middle plate, the opening communicating with the space for the functional module passing therethrough to enter into the space;
  a first access flap pivotably connected to a first side of the opening, the first access flap comprising:
  a rotating plate configured to rotate between a first position obstructing a first part of the opening and a second position perpendicular to the middle plate; and
  a sliding plate slidably attached to the rotating plate, the rotating plate defining a plurality of first air holes, the sliding plate defining a plurality of second air holes, the sliding plate having a first end abutting against the middle plate of the base and driving the sliding plate to slide to make the second air holes align with the first air holes when the rotating plate is located at the second position, and a second end coupled with the rotating plate via a first elastic member, the first elastic member restores the sliding plate when the rotating plate is located at the first position so that the second air holes are staggered with the first air holes;
  a second elastic member connected to the rotating plate and the base for restoring the rotating plate to obstruct the first part of the opening;
  a second access flap pivotably connected to an opposite second side of the opening and configured to rotate between a first position obstructing a second part of the opening, and a second position perpendicular to the middle plate; and
  a third elastic member connected to the second access flap and the base for restoring the second access flap to obstruct the second part of the opening.

12. The server chassis as claimed in claim 11, wherein the first elastic member is a compression spring; the second and third elastic members are torsion springs.

13. The server chassis as claimed in claim 11, wherein the base comprises a mounting plate formed at one side of the space adjacent to the first access flap; the mounting plate defines a plurality of vents; upon a condition that the rotating plate of the first access flap is located at the second position, the first air holes of the rotating plate and the second air holes of the sliding plate are aligned with the vents.

14. The server chassis as claimed in claim 11, wherein the rotating plate comprises a main wall and two first sidewalls extending from opposite sides of the main wall; each of the first sidewalls has two spaced protrusions extending therefrom toward the opposite first sidewall; the sliding plate comprises two opposite sliding plate sidewalls; each of the sliding plate sidewalls defines two spaced gaps corresponding to the protrusions of the first sidewall of the rotating plate.

15. The server chassis as claimed in claim 14, wherein the second access flap defines a notch in an end away from the second side of the opening; an engaging portion protrudes from the first end of the sliding plate; the rotating plate comprises a second sidewall facing the first end of the sliding plate; a slot is defined in the second sidewall; the engaging portion extends through the slot of the rotating plate and is received in the notch of the second access flap when the first and second access flaps obstruct the opening.

16. The server chassis as claimed in claim 15, wherein the rotating plate comprises a third sidewall opposite to the second sidewall; two elastic stop members extend from the main wall adjacent to the third sidewall, for abutting against the sliding plate.

* * * * *